US009439322B1

(12) United States Patent
Magcale et al.

(10) Patent No.: US 9,439,322 B1
(45) Date of Patent: Sep. 6, 2016

(54) MODULAR DATA CENTER DEPLOYMENT METHOD AND SYSTEM FOR WATERBORNE DATA CENTER VESSELS

(71) Applicant: Nautilus Data Technologies, Inc., San Ramon, CA (US)

(72) Inventors: Arnold C. Magcale, San Ramon, CA (US); Daniel Kekai, San Ramon, CA (US)

(73) Assignee: Nautilus Data Technologies, Inc., Pleasanton, CA (US)

( * ) Notice: Subject to any disclaimer, the term of this patent is extended or adjusted under 35 U.S.C. 154(b) by 60 days.

(21) Appl. No.: 14/591,525

(22) Filed: Jan. 7, 2015

Related U.S. Application Data

(60) Provisional application No. 61/925,522, filed on Jan. 9, 2014.

(51) Int. Cl.
H05K 7/20 (2006.01)
H05K 7/14 (2006.01)
H01L 23/473 (2006.01)

(52) U.S. Cl.
CPC ........ H05K 7/1497 (2013.01); H05K 7/20781 (2013.01)

(58) Field of Classification Search
CPC .......... G06F 1/181–1/189; G06F 1/16; G06F 1/1613–1/1698; H05K 7/20218–7/20381; H05K 7/20409–7/20418; H05K 7/20009–7/202; H05K 5/00–5/069; H05K 7/00–7/186; H01L 23/367–23/3677; H01L 23/473; H01L 23/46–23/467
USPC ........................ 361/676–678, 679.46–679.54, 361/688–723, 756, 741, 686, 687, 725, 787, 361/789, 794, 807–810; 165/80.1–80.5, 165/104.33, 185; 174/15.1–15.3, 174/16.1–16.3, 547, 548; 257/712–722, 257/E23.088; 24/453, 458–459; 454/184; 312/236

See application file for complete search history.

(56) References Cited

U.S. PATENT DOCUMENTS 5,293,540 A * 3/1994 Trani ........................ G09G 5/36
348/584
6,212,895 B1 4/2001 Richardson
(Continued)

FOREIGN PATENT DOCUMENTS

JP 2010269641 12/2010
WO 0048288 8/2000
(Continued)

OTHER PUBLICATIONS http://www.nolimitssoftware.com/wp-content/uploads/2013/03/DCIM-Guide.pdf.

*Primary Examiner* — Anthony Haughton
*Assistant Examiner* — Razmeen Gafur
(74) *Attorney, Agent, or Firm* — Fernandez & Associates, LLP

(57) ABSTRACT

A modular data center build method and system including pre fabricated data center modules comprised of a plurality of racks, a plurality of rack mounted computer systems, a door, electrical systems, cooling systems, power connections, water connections, video systems, biometric access system and a fire safety system. A steel beam structure may be employed to secure multiple vertical levels of a plurality of data center modules. The described modular data center build method and system with pre fabricated data center modules may be employed to quickly deploy a data center in a repeatable sustainable manner, drastically reducing the build deployment time of a data center from design to fully operational.

7 Claims, 2 Drawing Sheets

Front Wall View of Data Center Module

(56) References Cited

U.S. PATENT DOCUMENTS

| | | | |
|---|---|---|---|
| 6,990,395 B2 | 1/2006 | Ransom et al. | |
| 7,058,710 B2 | 6/2006 | McCall et al. | |
| 7,278,273 B1 | 10/2007 | Whitted et al. | |
| 7,525,207 B2 | 4/2009 | Clidaras et al. | |
| 7,561,411 B2 * | 7/2009 | Johnson, Jr. | H02J 9/062 307/66 |
| 7,589,436 B2 * | 9/2009 | Takahashi | G06F 1/30 307/112 |
| 7,738,251 B2 | 6/2010 | Clidaras et al. | |
| 8,359,191 B2 | 1/2013 | Chen et al. | |
| 8,411,439 B1 * | 4/2013 | Carlson | H05K 7/20827 165/104.33 |
| 8,456,036 B2 * | 6/2013 | Kotlyar | H02J 9/062 307/56 |
| 8,549,869 B1 * | 10/2013 | Whitted | G06F 1/16 165/104.33 |
| 8,853,872 B2 | 10/2014 | Clidaras et al. | |
| 2002/0010709 A1 | 1/2002 | Culbert et al. | |
| 2002/0066040 A1 * | 5/2002 | Rozenberg | H04L 63/0861 726/5 |
| 2005/0162836 A1 * | 7/2005 | Briggs | G06F 1/181 361/724 |
| 2006/0259201 A1 | 11/2006 | Brown | |
| 2007/0213000 A1 | 9/2007 | Day | |
| 2007/0281639 A1 | 12/2007 | Clidaras et al. | |
| 2008/0209234 A1 | 8/2008 | Clidaras et al. | |
| 2008/0278889 A1 * | 11/2008 | Briggs | G06F 1/181 361/608 |
| 2009/0037268 A1 | 2/2009 | Zaid et al. | |
| 2009/0043578 A1 * | 2/2009 | Burke | G07C 9/00158 704/246 |
| 2009/0083126 A1 | 3/2009 | Koren et al. | |
| 2009/0084297 A1 | 4/2009 | Choi et al. | |
| 2009/0126910 A1 | 5/2009 | Campbell et al. | |
| 2009/0164797 A1 * | 6/2009 | Kramer | G06F 21/32 713/186 |
| 2009/0207567 A1 | 8/2009 | Campbell et al. | |
| 2009/0295167 A1 | 12/2009 | Clidaras et al. | |
| 2009/0299824 A1 | 12/2009 | Barnes | |
| 2010/0030552 A1 | 2/2010 | Chen et al. | |
| 2010/0223085 A1 * | 9/2010 | Gauthier | G06F 1/182 709/200 |
| 2010/0298997 A1 | 11/2010 | Ohba et al. | |
| 2011/0060470 A1 | 3/2011 | Campbell et al. | |
| 2011/0072293 A1 | 3/2011 | Mazzaferri et al. | |
| 2011/0207391 A1 | 8/2011 | Hamburgen et al. | |
| 2012/0042263 A1 | 2/2012 | Rapaport et al. | |
| 2012/0136998 A1 | 5/2012 | Hough et al. | |
| 2012/0147552 A1 * | 6/2012 | Driggers | G06F 1/183 361/679.53 |
| 2012/0166433 A1 | 6/2012 | Tseng | |
| 2012/0166616 A1 | 6/2012 | Meehan et al. | |
| 2012/0243170 A1 * | 9/2012 | Frink | G06F 1/187 361/679.34 |
| 2013/0044426 A1 * | 2/2013 | Neumann | G06F 1/20 361/679.54 |
| 2013/0069504 A1 * | 3/2013 | Briggs | G06F 1/181 312/223.6 |
| 2013/0148291 A1 * | 6/2013 | Slessman | G06F 1/20 361/679.46 |
| 2013/0200764 A1 * | 8/2013 | Archibald | G06F 1/20 312/223.2 |
| 2013/0201618 A1 * | 8/2013 | Czamara | H05K 7/20 361/679.5 |
| 2013/0210335 A1 * | 8/2013 | Krietzman | H05K 5/0213 454/184 |
| 2013/0235519 A1 * | 9/2013 | Miyauchi | F24F 11/02 361/679.46 |
| 2013/0238795 A1 | 9/2013 | Geffin et al. | |
| 2014/0146459 A1 * | 5/2014 | Hazzard | H05K 7/1498 361/679.21 |
| 2014/0254089 A1 * | 9/2014 | Eichelberg | H05K 5/0213 361/679.46 |
| 2014/0259618 A1 | 9/2014 | Rikoski et al. | |
| 2014/0355185 A1 * | 12/2014 | Ehlen | H05K 1/14 361/679.5 |
| 2014/0360753 A1 * | 12/2014 | Sechrist | H05K 7/1449 174/79 |

FOREIGN PATENT DOCUMENTS

| | | |
|---|---|---|
| WO | 2009055368 | 4/2009 |
| WO | 2010129341 | 11/2010 |
| WO | 2012047746 | 4/2012 |
| WO | 2013113138 | 8/2013 |

* cited by examiner

Front Wall View of Data Center Module

Top View of Data Center Module

MODULAR DATA CENTER DEPLOYMENT METHOD AND SYSTEM FOR WATERBORNE DATA CENTER VESSELS

CROSS REFERENCE TO RELATED APPLICATIONS

This application claims reference to Provisional Patent application No. 61/925,522 filed on Jan. 9, 2014, entitled "A modular data center deployment method and system for waterborne data center vessels".

BACKGROUND

Problem Solved

A data center is a facility designed to house, maintain, and power a plurality of computer systems. A conventional data center is constructed entirely on-site with installation of all electrical, mechanical and cooling equipment performed on site after construction of the data center facility is completed. Design and deployment of a conventional data center requires extensive time in planning and construction. Data center deployment cycles can take two years from start to fully operational.

Traditional data center deployment methods require extensive time for planning and construction. All electrical, mechanical and cooling systems are fabricated and constructed on site after the construction of the data center facility building has been completed. After the data center construction has been completed, installing racks to house the computer systems is another time consuming effort that may take additional weeks to complete.

The described methods and systems include use of pre-fabricated data center modules, which when employed, drastically reduce the build deployment time of a data center facility from start to fully operational.

SUMMARY

Embodiments disclosed include a modular data center, comprising a data center module, which further comprises a top wall, a left side wall, a right side wall, and a bottom wall, and a door. The module also comprises a plurality of power connections comprised in an electrical system power distribution unit, cooling distribution means comprising coolant distribution piping embedded in the said top wall, left side wall, right side wall, and bottom wall. Additionally, housed inside the module are a plurality of racks comprising means for fastening a corresponding plurality of rack mountable computer systems, a means for housing a fire suppressant system, a means for housing an internal video system, a means for housing an external video system; and a biometric access system.

DETAILED DESCRIPTION

As stated above, a data center is a facility designed to house, maintain, and power a plurality of computer systems. A present day data center is constructed entirely on site with installation of all electrical, mechanical and cooling equipment performed on site after construction of the data center facility is completed. Design and deployment of a data center requires extensive time in planning and construction. Data center deployment cycles can take two years from start to fully operational.

Embodiments disclosed in this document include modular data center deployment methods and systems, and more particularly, for waterborne data center vessels. The methods and systems disclosed drastically reduce data center facility deployment times, from start to fully operational. The methods and systems disclosed may be employed to quickly deploy pre-fabricated data center modules in a repeatable and sustainable manner.

Embodiments disclosed include improved data center deployment methods and systems. Preferred embodiments include improved methods and systems for quick, efficient deployment of data center modules on a waterborne data center vessel. The method and system may be employed to quickly deploy a plurality of data center modules in a waterborne data center facility dramatically reducing build cycle time from start to a fully operational data center.

Fabricating and constructing data center electrical, mechanical and cooling systems on site is time intensive and may be subject to delays or errors. These construction methods require extensive time in planning and on site fabrication of interdependent systems.

The described methods and systems including use of prefabricated data center modules may be employed to drastically reduce the build deployment time of a data center facility from start to fully operational.

Figure 1:
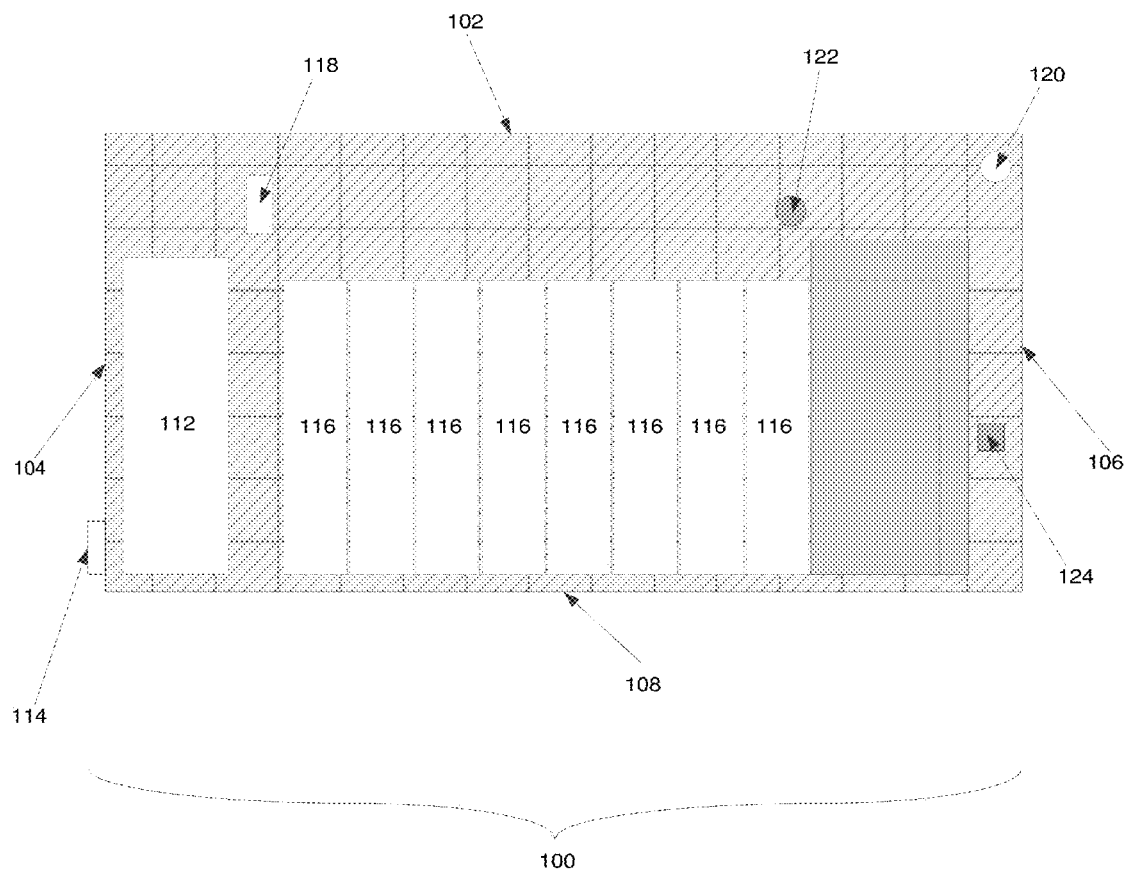
FIG. 1 illustrates a side view of a modular system data center module, in an embodiment.

FIG. 1 illustrates a side view of a modular system data center module, in an embodiment. The illustrated embodiment includes data center module 100, top wall 102, left side wall 104, right side wall 106, bottom wall 108, door 110, electrical systems 112, power connections 114, racks 116, fire suppressant system 118, internal video system 120, external video system 122, and biometric access system 124.

Figure 2:
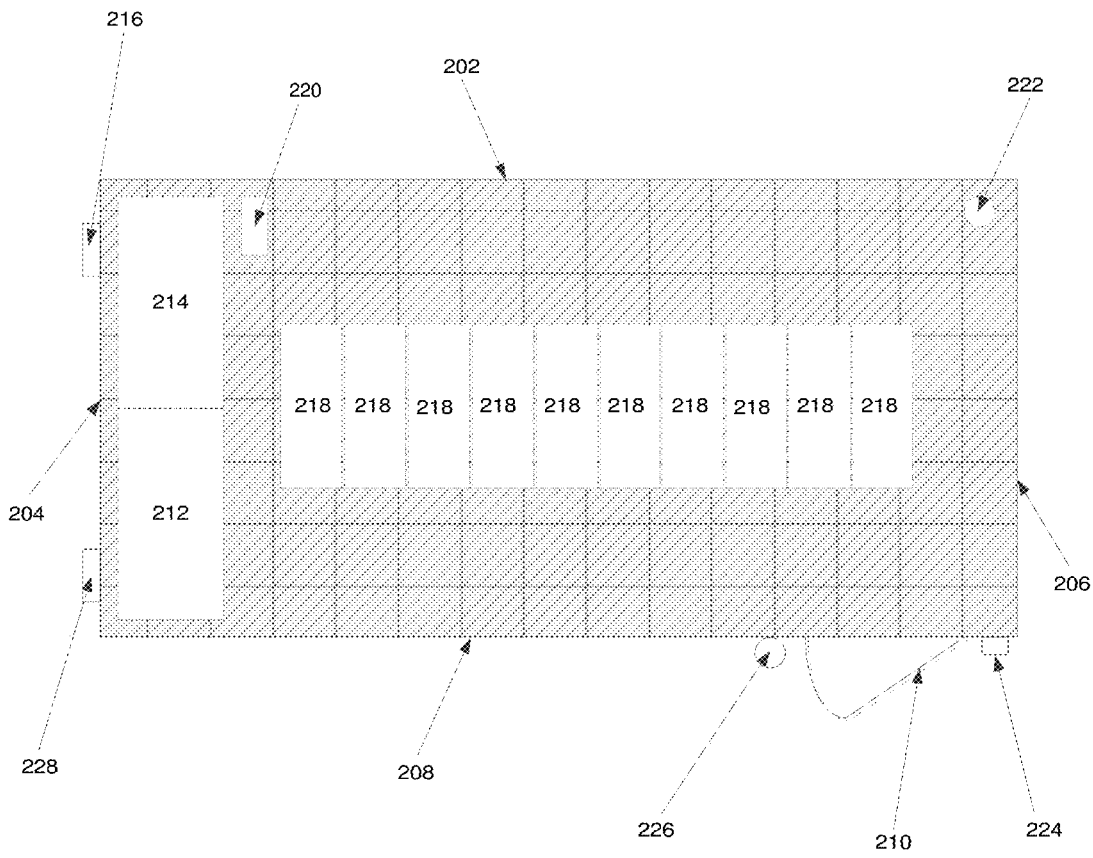
FIG. 2 illustrates a top view of modular system data center module in an embodiment.

FIG. 2 illustrates a top view of modular system data center module in an embodiment. The illustrated embodiment includes data center module 200, back wall 202, left side wall 204, right side wall 206, front wall 208, door 210, electrical systems 212, cooling systems 214, racks 218, fire suppressant system 220, internal video system 222, biometric access system 224, external video system 226, and power connections 228.

The illustrated embodiment includes data center module 100, which is rectangular in shape. The data center module 100 includes a front wall 208, a back wall 202, a top wall102, a bottom wall 108, a left side wall 104, and a right side wall 106. The side walls (104, 106) front wall 208 and back wall 202 are perpendicularly connected to the top wall 102 and the bottom wall 108. A plurality of computer systems (not shown) may be housed in a plurality of racks 116. The data center module 100 may include cooling systems 114 and electrical systems 112 to support the computer systems (not shown). Water connections 216 may be connected to an external closed looped cooling system (not shown) for cold water supply and hot water return. A fire suppressant system 118, internal video system 120, biometric access system 124 and external video system 122 may be included for security and safety of the data center module 100.

In this embodiment the data center module 100 is used to house a plurality of computer systems in a plurality of racks 118. Electrical systems 212, cooling systems 214, video security systems (222, 224) and fire suppressant systems 220 may also be included. A plurality of computer systems are housed in a plurality of racks 118. Requisite power is supplied to the computer systems by the electrical systems 112.

The cooling system 114 connected to a closed loop cooling system (not shown) through the water connections 116 maintains interior ambient conditions suitable for proper operation of computer systems. The entire computing module may be secured with internal video system 122, external video system 126 and biometric access system 124 that controls access to the data center module100.

The electrical, cooling and computer systems of the data center module may be protected from fire by the fire suppressant system 120. A steel beam structure (not pictured) may be employed to secure a plurality of data center modules in rows that may be stacked in a vertical manner.

Preferred embodiments include a data center module in the shape of a shipping container with eight walls that are insulated and built to support a plurality of computer systems, racks, electrical systems, cooling systems, fire suppressant systems and security systems. Pre-designed and installable electrical and cooling systems are an integrated part of the entire data center module, designed to work together to support a plurality of computer systems. Pre-designed and installable video systems and biometric access system for controlling access and securing computer systems are integrated within the modular framework. Pre-designed and installable fire suppressant systems for the data center module are also integrated within the modular framework.

Preferred embodiments include all of the above mentioned elements.

In an additional embodiment, cable management ladders may be used to manage network or power cabling. Flexible cable manager ladders may be used for each individual rack such that the rack may slide forward for easier access to the back of the computer systems with the flexible ladders maintaining management of all cabling.

The racks may include wheels that are recessed in a track system that enable the rack to be slid forward. This track system may also include quick lock mechanisms to secure the rack in place either in the normal position or in a maintenance position when accessing the rear of the computer systems.

The data center module may also include a plurality of wireless sensors used to collect data for a data center infrastructure management suite. The data collected may be used to automate control of the systems installed in the data center data center module.

The data center module may be configured in accordance to International Organization of Standardization (ISO) container manufacturing standards.

A plurality of data center modules may be installed on a steel beam structure designed and constructed to accommodate multiple levels of data center modules. The steel beam structure may include a stair case at either end for access to the second level or above.

The internals of the data center module may be arranged in any number of variations to accommodate various electrical, cooling, rack, video or security systems.

The data center module door or doors may be installed in one or both of the side walls. The water connections may be installed in the back, front, left side or right side walls. The video cameras may be installed in any number of internal or external locations.

The power connections may be installed in the back, front, left side or right side walls.

The electrical systems may be configured for AC or DC power distribution. The electrical systems may be designed for any number of primary voltage schemes.

Preferably, the data center data center module 100 is securely installed on the waterborne data center vessel (not shown). Power would be connected to the data center data center module 100 electrical systems 112 through the power connections 114. A closed loop cooling system (not shown) would be connected to the data center module cooling system 214 through the water connections 216. The video systems (120, 122) would be connected to a master security system (not shown). The biometric access system would be connected to a remote security access system (not shown) to control access to the data center data center module internal systems.

Additionally: Potentially, this invention could be deployed in land based data centers, office buildings, hospitals, multi tenant dwellings, stadiums, universities or lab buildings.

Additionally, partial or complete embodiments of the disclosed invention can be utilized in alternate applications without departing from the scope and spirit of the disclosure. For example, water based closed loop cooling systems that leverage natural resources within close proximity can be utilized to cool virtually anything, including but not limited to buildings or dwellings, in energy efficient and cost effective manner.

Since various possible embodiments might be made of the above invention, and since various changes might be made in the embodiments above set forth, it is to be understood that all matter herein described or shown in the accompanying drawings is to be interpreted as illustrative and not to be considered in a limiting sense. Thus it will be understood by those skilled in the art of water borne vessels, and computer data centers and that although the preferred and alternate embodiments have been shown and described in accordance with the Patent Statutes, the invention is not limited thereto or thereby.

The figures illustrate the architecture, functionality, and operation of possible implementations of systems, methods and computer program products according to various embodiments of the present invention. It should also be noted that, in some alternative implementations, the functions noted/illustrated may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some portions of embodiments disclosed are implemented as a program product for use with an embedded processor. The program(s) of the program product defines functions of the embodiments (including the methods described herein) and can be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive, solid state disk drive, etc.); and (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-accessible format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

The present invention and some of its advantages have been described in detail for some embodiments. It should be understood that although the system and process is described with reference to a modular data center deployment method and system for waterborne data center vessels, the system and process may be used in other contexts as well. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

We claim:

1. A modular data center, comprising:
   a data center module, which further comprises:
      a top wall, a front wall, a back wall, a left side wall, a right side wall, and a bottom wall;
      a door;
      a plurality of power connections comprised in an electrical system power distribution unit;
      cooling distribution means comprising coolant distribution piping embedded in the top wall, left side wall, right side wall, and bottom wall;
      a plurality of racks comprising:
         means for fastening a corresponding plurality of rack mountable computer systems; and
         a plurality of wheels for enabling each individual rack of the plurality of racks to be slid;
      a means for housing a fire suppressant system;
      a means for housing an internal video system;
      a means for housing an external video system; and
      a biometric access system.

2. The modular data center of claim 1 wherein the left side wall, the right side wall, front wall, and back wall are perpendicularly connected to the top wall and the bottom wall.

3. The modular data center of claim 1 wherein the cooling distribution means further comprises a plurality of water connections, compatible with an external closed looped cooling system for cold water supply and hot water return.

4. The modular data center of claim 1 wherein each rack of the plurality of racks is comprised in a beam structure configured to allow a plurality of data center modules to be secured in vertically stacked rows.

5. The modular data center of claim 1 further comprising a plurality of flexible cable management ladders configured to manage network or power cabling such that each cable management ladder of the plurality of flexible cable management ladders is configured to allow each individual rack to slide forward to provide an access a back portion of the computer systems.

6. The modular data center of claim 1 further comprising a plurality of wireless sensors configured to collect data for a data center infrastructure management suite.

7. The modular data center of claim 6 wherein the data center infrastructure management suite is configured to control the electrical system power distribution unit, the cooling distribution means, the fire suppressant system, the internal video system, and the external video system installed in the data center data center module.

* * * * *